United States Patent
Liu et al.

(10) Patent No.: US 6,434,413 B1
(45) Date of Patent: Aug. 13, 2002

(54) SHIFTING SAMPLING WINDOW AND INTERLEAVES SPARSE K-SPACE DATA ACQUISITION FOR IMPROVED TEMPORAL RESOLUTION

(75) Inventors: Kecheng Liu, Solon; Neil Palmer, Twinsburg; Mark Loncar, Mentor, all of OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/448,787

(22) Filed: Nov. 24, 1999

(51) Int. Cl.[7] ................................. A61B 5/05
(52) U.S. Cl. .................. 600/410; 600/419; 600/420; 324/307; 324/309
(58) Field of Search .................. 600/420, 410, 600/419; 324/307, 309

(56) References Cited

U.S. PATENT DOCUMENTS

| | | | |
|---|---|---|---|
| 4,767,991 A | * | 8/1988 | Rzedzian |
| 5,327,088 A | * | 7/1994 | Pipe |
| 5,590,654 A | * | 1/1997 | Prince |
| 5,650,723 A | * | 7/1997 | Meyer |
| 6,198,959 B1 | * | 3/2001 | Wang |

* cited by examiner

Primary Examiner—Marvin M. Lateef
Assistant Examiner—Jeoyuh Lin
(74) Attorney, Agent, or Firm—Fay, Sharpe, Fagan, Minnich & McKee, LLP

(57) ABSTRACT

A method of magnetic resonance imaging includes subjecting a region of a patient being imaged to magnetic resonance imaging pulse sequences thereby generating magnetic resonance echoes emanating from the region. The echoes are encoded with magnetic gradients and collected as k-space data in separate consecutive acquisitions. Each acquisition successively fills in one of a number of distinct subsets of k-space based on the encoding of the collected echoes for that acquisition. In turn, a reconstruction algorithm is applied to the k-space data after each acquisition to generate a series of temporally updated image representations of the region. Further, a magnetic resonance imaging apparatus for performing the method is also provided.

14 Claims, 4 Drawing Sheets

SHIFTING SAMPLING WINDOW AND INTERLEAVES SPARSE K-SPACE DATA ACQUISITION FOR IMPROVED TEMPORAL RESOLUTION

BACKGROUND OF THE INVENTION

The present invention relates to the art of magnetic resonance imaging (MRI). It finds particular application in conjunction with magnetic resonance angiography (MRA), and will be described with particular reference thereto. However, it is to be appreciated that the present invention is also amenable to other like applications.

Commonly, in MRI, a substantially uniform, temporally constant main magnetic field, $B_0$, is set up in an examination region in which a subject being imaged is placed. Via magnetic resonance radio frequency (RF) excitation and manipulations, selected magnetic dipoles in the subject which are otherwise aligned with the main magnetic field are tipped (via RF pulses) into a plane transverse to the main magnetic field such that they precess or resonate. In turn, the resonating dipoles are allowed to decay or realign with the main magnetic field thereby inducing magnetic resonance echoes. The various echoes making up the MRI signal are encoded via magnetic gradients set up in the main magnetic field. The raw data from the MRI apparatus is collected into a matrix commonly known as k-space. Typically, each echo is sampled a plurality of times to generate a data line or row of data points in k-space. The echo or data lines position in k-space is determined by its gradient encoding. Ultimately, employing Inverse Fourier or other known transformations, an image representation of the subject is reconstructed from the k-space data.

With regard to MRA, typically, a bolus of contrast solution is introduced into the subjects vascular system which aids in the visualization of the blood vessels and/or other associated anatomy being imaged. Generally, it is desirable to time any image acquisitions such that they commence at the arrival of the bolus in the region or volume of interest. Moreover, it is desirable to achieve a temporal resolution significantly fine enough to accurately track the bolus within the region or volume of interest.

With respect to the timing of an acquisition, one previously developed technique involves the attending medical personnel or technician simply estimating the time from introduction to arrival based upon the available information on the vascular system and/or blood flow rates. There are no direct measurements or observations made to determine the actual arrival of the bolus in the region or volume of interest. Rather, the acquisition simply begins at the expiration of the estimated time period. Due to uncontrollable factors that varied from time to time and patient to patient (e.g., the variable blood flow rates, the distinct vascular systems of different patients, etc.), often the estimates are inexact. Consequently, this technique tends to be less precise than desirable.

In another previously developed acquisition timing technique, a direct measure or observation is made to determine the arrival of the bolus. In this technique, prior to arrival, quick low resolution scans are focused on the blood vessel which would carry the bolus into the region or volume of interest. Detection of a relatively larger signal indicates that the bolus has entered the region or volume of interest. In turn, detection of the jump in signal strength triggers the acquisition. However, as the bolus has already arrived, acquisition is started later than is otherwise desired. That is to say, the entrance of the bolus into the region or volume of interest is not acquired. Rather, there is some delay between detection of the bolus and acquisition.

The present invention contemplates a new and improved technique for addressing temporal resolution and acquisition timing which overcomes the above-referenced problems and others.

SUMMARY OF THE INVENTION

In accordance with one aspect of the present invention, a method of magnetic resonance imaging is provided. The method includes subjecting a region of a patient being imaged to magnetic resonance imaging pulse sequences thereby generating magnetic resonance echoes emanating from the region. The echoes are encoded with magnetic gradients and collected as k-space data in separate consecutive acquisitions. Each acquisition successively fills in one of a number of distinct subsets of k-space based on the encoding of the collected echoes for that acquisition. In turn, a reconstruction algorithm is applied to the k-space data after each acquisition to generate a series of temporally updated image representations of the region.

In accordance with another aspect of the present invention, a method of magnetic resonance imaging includes generating magnetic resonance echoes which emanate from a region of a patient being imaged. The echoes are acquired as sampled data with each acquisition resulting in a distinct fractional portion of k-space being filled in. The echoes are repeatedly generated and acquired until k-space is completely filled in such that the distinct fractional portions of k-space are interleaved with one another. In turn, a reconstruction algorithm is applied to the data in k-space to generate an image representation of the region.

In accordance with another aspect of the present invention, a magnetic resonance imaging apparatus is provided. It includes a main magnet that generates a substantially uniform, temporally constant main magnetic field through an examination region of a subject being imaged. A magnetic gradient generator produces magnetic gradients in the main magnetic field across the examination region. A transmission system includes an RF transmitter that drives an RF coil which is proximate to the examination region. A sequence control manipulates the magnetic gradient generator and the transmission system to produce a plurality MRI pulse sequences. Each of the MRI pulse sequences induces magnetic resonance echoes which emanate from the examination region. A reception system includes a receiver that receives and samples the echoes to acquire k-space data such that distinct interleaved subsets of k-space are successively filled in and updated with each acquisition. A data memory which stores the k-space data from the receiver. A reconstruction processor that accesses the data memory following each successive acquisition to reconstruct the k-space data into temporally resolved image representations of the examination region, and an output device converts the image representations into a human viewable display.

One advantage of the present invention is improved temporal resolution.

Another advantage of the present invention is that in MRA image acquisition is readily timed with the arrival of a contrast bolus.

Yet another advantage of the present invention is that relatively long acquisitions can be realized without subjecting a patient to an uncomfortably long breath-hold time.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
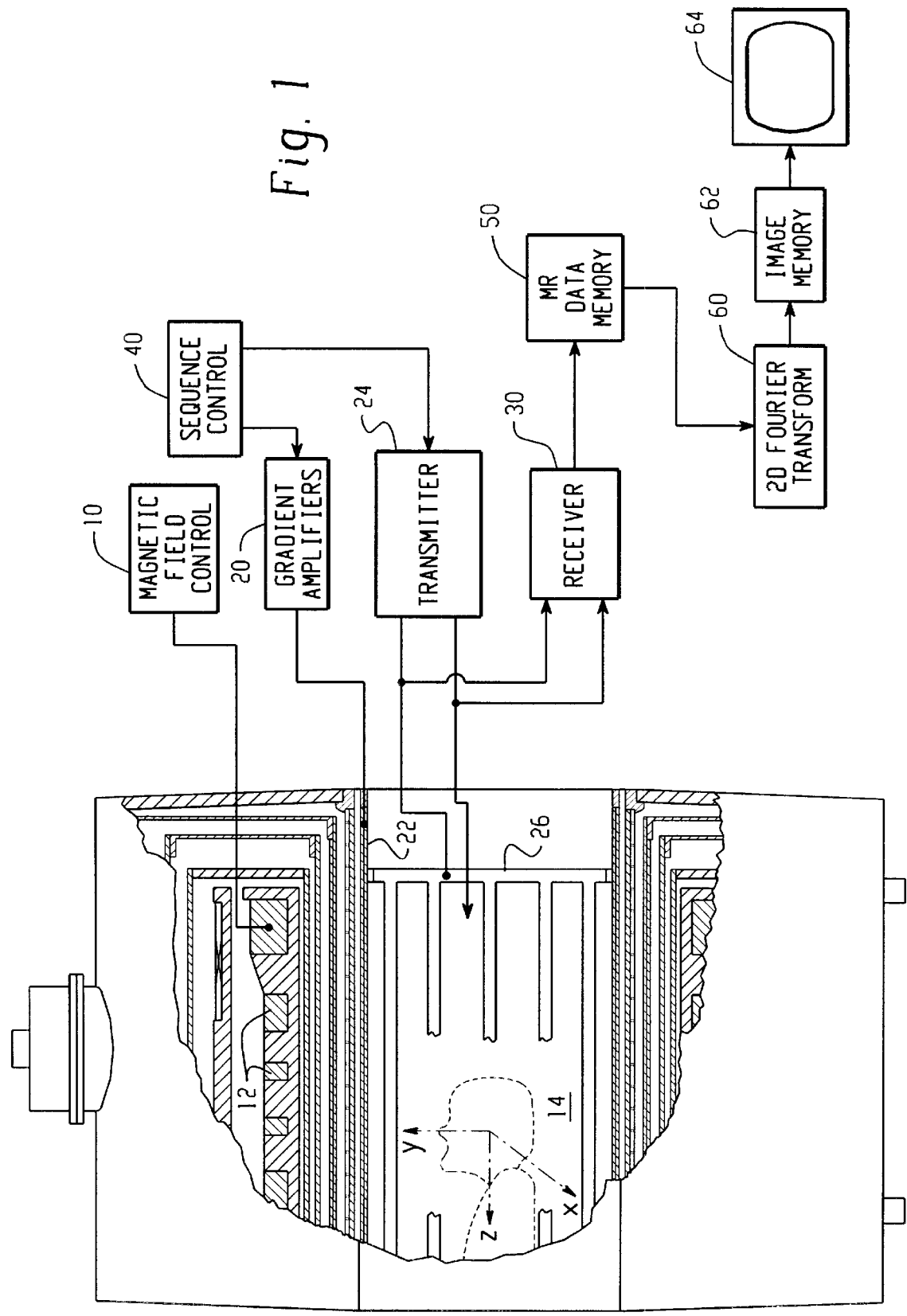
FIG. 1 is a diagrammatic illustration of an MRI apparatus in accordance with aspects of the present invention.

With reference to FIG. 1, a main magnetic field control 10 controls superconducting or resistive magnets 12 such that a substantially uniform, temporally constant main magnetic field, $B_0$, is created along a z axis through an examination region 14. A couch (not illustrated) suspends and/or positions a subject to be examined, such as a patient, within the examination region 14. A magnetic resonance echo means applies a series of RF and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate MRI sequences. More specifically, gradient pulse amplifiers 20 apply current pulses to selected ones or pairs of gradient coil assemblies 22 to create magnetic field gradients along x, y, and z axes of the examination region 14. An RF transmitter 24 drives a whole-body RF coil 26 to transmit RF pulses or pulse packets into the examination region 14. A typical RF pulse is composed of a packet of immediately contiguous pulse segments of short duration, which taken together with each other and any applied gradients, achieve a selected magnetic resonance manipulation. For whole-body applications, the resonance signals or echoes are commonly picked up by the whole-body RF coil 26.

For generating images of local regions of the subject, specialized RF coils are placed contiguous to the selected region of interest. For example, an insertable RF coil may be inserted surrounding a selected region at the isocenter of the bore. The insertable RF coil is used to excite magnetic resonance and receive magnetic resonance signals emitted from the patient in the region being examined. Alternatively, the insertable RF coil can be used to only receive resonance signals introduced by the whole-body RF coil 26. In any event, the resultant RF signals are picked up by the whole-body RF coil 26, the insertable RF coil, a surface coil, or another specialized RF coil and demodulated by a receiver 30.

A sequence control circuit 40 controls the gradient pulse amplifiers 20 and the transmitter 24 to produce a plurality of MRI pulse sequences that generate and gradient encode (i.e., phase and frequency encode) the echoes received and sampled by the receiver 30. The MRI pulse sequence employed optionally generates an MR signal for either two-dimensional (2D) or three-dimensional (3D) imaging. For example, the MRI pulse sequences employed optionally include any of a plurality of single echo or multi-echo imaging sequences, such as, field echo (FE) imaging, spin echo (SE) imaging, echo planar imaging (EPI), echo volume imaging, gradient and spin echo (GSE) imaging, fast spin echo (FSE) imaging, single shot FSE imaging, three-dimension volume FSE imaging, and the like. In the case of 2D imaging, the region of interest represents a 2D cross-sectional slice through the subject being imaged. In the case of 3D imaging, the region of interest represents a 3D volume of the subject being imaged.

Regardless of the MRI pulse sequence employed, the sequence control 40 coordinates the plurality of MRI pulse sequences that generate the MR signals received by the receiver 30. For the selected sequence, the receiver 30 samples each echo a plurality of times resulting in data lines or arrays of sampled data points representing each echo. This raw MR data is then loaded into an MR data memory or buffer 50. The MR data memory 50 represents the data matrix commonly know as k-space. Based upon the particular gradient encoding imparted to each echo, the corresponding MR data is mapped to or otherwise assigned a location in k-space.

Figure 2:
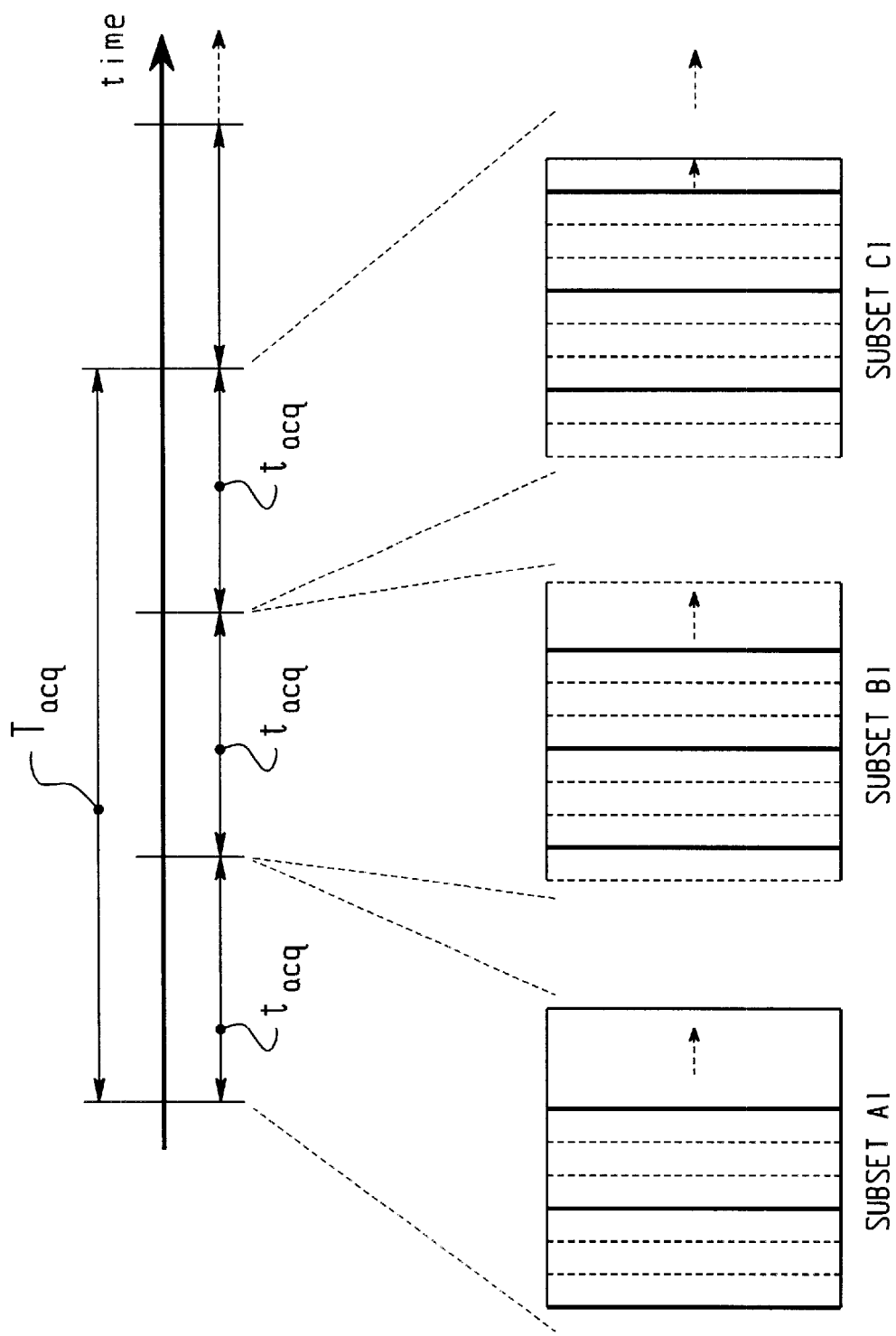
FIG. 2 is a time-line showing an exemplary method of k-space data acquisition in accordance with aspects of the present invention.

With further reference to FIG. 2, a time-line shows the total acquisition time, $T_{acq}$, which would otherwise lapse during a single acquisition used to completely fill in all of k-space. In a preferred embodiment of the present invention, rather than a single acquisition, a number n (e.g., n=2, 3, 4, 5, etc.) of separate consecutive acquisitions are iteratively employed to fill k-space. Each separate acquisition fills in a distinct subset or fractional portion 1/n of k-space with the sampled data from the echoes collected during that acquisition. As shown in FIG. 2, for example, with n=3, there are three acquisitions and three distinct subsets of k-space (nominally termed herein as A1, B1, and C1) which are successively filled in on consecutive acquisitions. Preferably, the subsets are of equal size with respect to one another, and the acquisitions of equal duration with respect to one another. For simplicity herein, FIG. 2 only shows the embodiment where n=3. However, in practice, n is optionally any integer number greater than 1.

With respect to the entire k-space, each acquired subset thereof can be considered as a sparse k-space data set which represents an undersampled image of the region of interest, with the undersampled image exhibiting an aliasing artifact upon reconstruction. Nevertheless, each undersampled image contains the same spatial information and resolution regarding the particular region of the subject being imaged. However, each separate acquisition has a duration or acquisition time which is n fold shorter than $T_{acq}$, i.e., $t_{acq}=(1/n)T_{acq}$, where $t_{acq}$ is the acquisition time of each separate acquisition.

Preferably, the subsets of k-space are interleaved with one another. That is to say, for example, in a 2D case with linear k-space trajectories, the data lines from each subset of k-space are interspersed with the data lines from the other subsets. For example, as shown in FIG. 2 by the heavier drawn lines representing filled in rows of k-space, subset A1 fills in rows 1, 4, 7, . . . , m of k-space; subset B1 fills in rows 2, 5, 8, . . . , m+1 of k-space; and, subset C1 fills in rows 3, 6, 9, . . . , m+2 of k-space. In this case, each staggered subset includes every nth row of k-space. Optionally, in a 3D implementation, similarly interspersed k-space data planes are employed in lieu of the data lines used in the 2D case.

Figure 3:
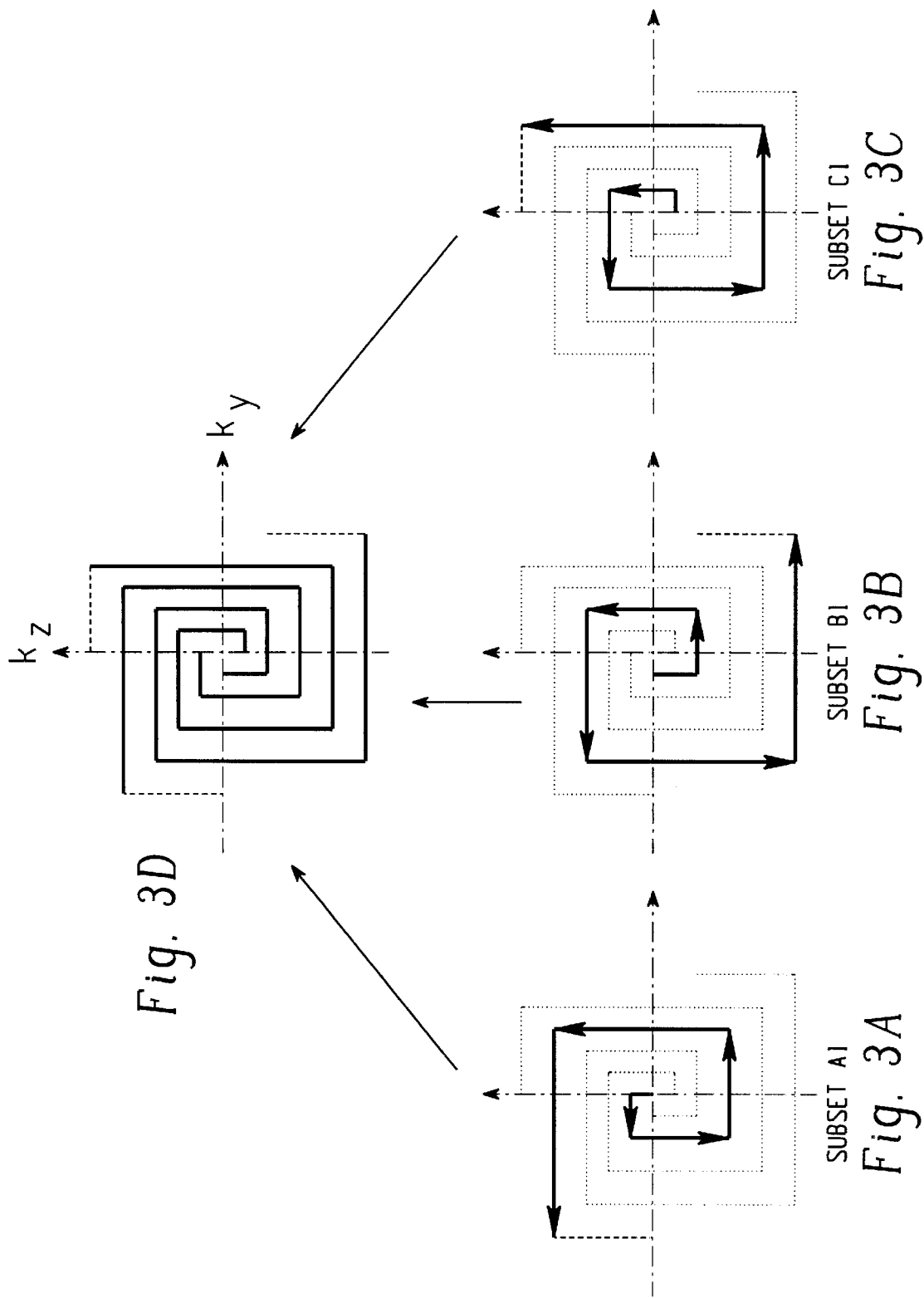
FIGS. 3A through 3C are diagrammatic illustrations showing exemplary subsets of k-space data acquired in a rectangular spiral trajectory in accordance with aspects of the present invention.
FIG. 3D is a diagrammatic illustration showing the combined interleaved subsets of k-space data from FIGS. 3A through 3C; and, FIG. 4 is a time-line showing an exemplary method of k-space data acquisition in accordance with aspects of the present invention with patient breath breaks between subset acquisitions.

In alternate implementations, the MR data fills in k-space in non-linear trajectories. For example, the k-space data (represented by the heavier drawn lines) in each interleaved subset is optionally filled in as shown in FIGS. 3A through 3C such that when the interleaved subsets are combined the entire k-space is filled in according to the rectangular spiral trajectory depicted in FIG. 3D. Optionally, still other k-space trajectories are used to fill in k-space.

The filling in of k-space preferably takes place in accordance with a defined order or sequence, e.g., acquiring subset A1, then acquiring subset B1, then acquiring subset C1, and so on until each subset of k-space is acquired. In a preferred embodiment, once k-space has been completely filled in, the sequence for acquiring k-space is repeated. In subsequent repetitions, k-space data from later acquisitions fill in their respective subsets of k-space replacing k-space data from corresponding prior acquisitions carried out in preceding repetitions. Accordingly, regardless of the repetition from which each acquisition is taken, any n consecutive acquisitions represents an entirely filled k-space. For example, in a second repetition, subset A2 is acquired replacing the data from subset A1, then subset B2 is acquired replacing the data from subset B1, then subset C2 is acquired replacing the data from subset C1, and so on until all n subsets are acquired in the second repetition. Thereafter, further repetitions or iterations are carried out in a like manner indefinitely as desired.

More specifically, as described by way of the example illustrated in FIG. 2, the complete k-space data set cycles through combinations of subsets as follows:

A1, B1, C1;
B1, C1, A2;
C1, A2, B2;
A2, B2, C2;
etc.

The successive combinations of subsets represents a temporally resolved k-space which is updated in time with each new acquisition. The temporal resolution achieved varies according the acquisition time $t_{acq}$ which is inversely proportional to n such that progressively higher values of n correspond to progressively finer temporal resolution.

With further reference again to FIG. 1, in a preferred embodiment, after each separate consecutive acquisition which fills in a subset of k-space, a multi-dimensional Fourier transform and/or other appropriate reconstruction algorithms are applied thereto by a reconstruction processor 60. That is to say, after each subset acquisition, the reconstruction processor 60 accesses the MR data memory 50 and performs on the temporally resolved k-space data therein a Fourier transformation and/or other appropriate algorithms, as are known in the art, to reconstruct an image representation of the region being imaged. Consequently, as the temporally resolved k-space is updated in time with each consecutive acquisition, the image representations reconstructed therefrom after each acquisition are likewise temporally resolved images which are updated in time with each consecutive reconstruction.

The temporally resolved images optionally represent a 2D planar slice through the patient, a 3D volume, or the like. After reconstruction, the images are then each optionally stored in an image memory 62 where they are accessed by a display, such as a video monitor 64 or other human viewable display or output device that selectively provides a depiction of a resultant image or images. In one preferred embodiment, seamless cine imaging is achieved by accessing and displaying each sequential image in relatively rapid succession to produce a time varying representations of the region of interest. Likewise, real-time imaging having a refresh rate interval of $t_{acq}$ is achieved by accessing and displaying each consecutive image as it is reconstructed.

In a preferred MRA embodiment, prior to or shortly after the initiation of an imaging experiment, a bolus of contrast solution is introduced into a patient's vascular system. The imaging experiment continues with successive temporally resolved images of the region of interest being continually generated and updated in the manner described herein. The images are observed to ascertain the moment of arrival of the bolus into the region being imaged. Thereafter, the progression of the bolus through the region is tracked in consecutive time displaced images. Optionally, the MRA procedure is carried out in real-time, or via seamless cine imaging as discussed above. In either case, images obtained prior to the bolus arriving in the region of interest are optionally discarded to conserve storage space in the image memory 62.

In another preferred embodiment, one of the images generated prior to the arrival of the bolus into the region of interest is selected as a reference image. Optionally, a weighted average of multiple images generated prior to the arrival of the bolus is employed as the reference image. The reference image is then subtracted from one or more selected images generated during the time the bolus is in the region of interest to further enhance the visualization of the contrast solution.

Figure 4:
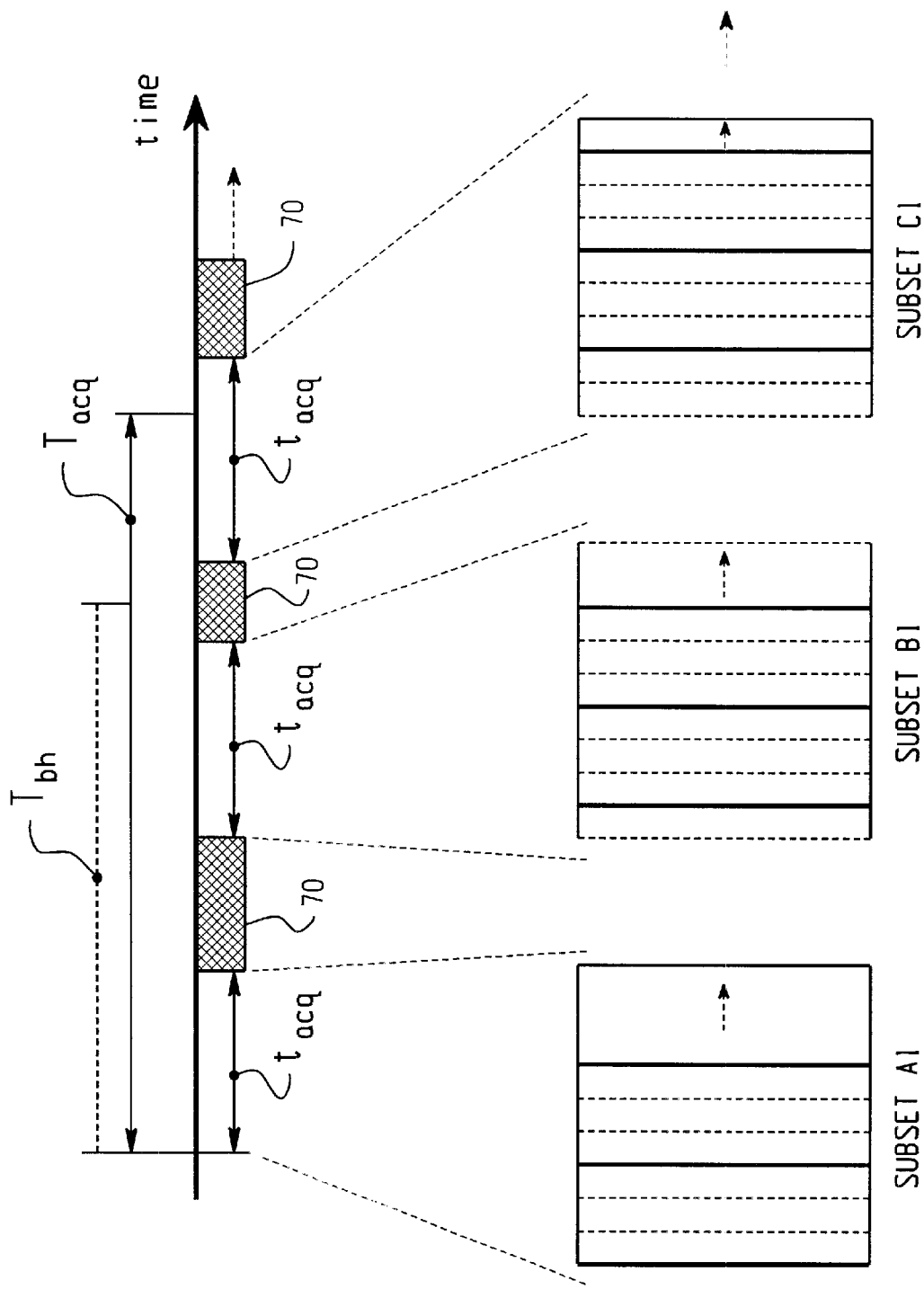

With reference to FIG. 4, in another preferred embodiment, temporal segmentation is employed to compensate for a patient's limited breath hold time. Where a patient's maximum breath hold time $T_{bh}$ is less than $T_{acq}$ motion artifacts due to the patient's respiration are encountered if collection of the entire set of k-space data is attempted in a single acquisition. However, the shorter acquisitions $t_{acq}$ employed in connection with the collection of the n subsets of k-space are readily endured by the patient without discomfort. Accordingly, the patient is made to hold their breath during each subset acquisition, and during breaks 70 or intermittent periods established between subset acquisitions the patient is permitted to relax and breathe freely. While during the breaks 70 the scanning process is optionally continued to maintain the steady-state of the MRI system, no k-space data is collected. In this operational mode then, acquisitions which are otherwise longer than the patient's breath hold time $T_{bh}$ are carried out in n separate consecutive acquisitions of k-space subsets that are temporally segmented from one another.

While the invention herein has been described with reference to the MRI apparatus detailed above, it is appreciated that the invention is applicable to other MRI apparatus. For example, the invention is equally amenable to open geometry magnets wherein opposing pole pieces, optionally joined by a ferrous flux return path, define an open examination region therebetween. Optionally, the data storage devices employed herein are random access memory (RAM), optical or electromagnetic disks, etc. In addition, while referred to separately, the data storage devices herein are optionally separately addressable regions of a single data storage device. The data processing is alternately carried out via hardware or software implementations or combinations of both.

Generally, the invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method of magnetic resonance imaging, said method comprising:

(a) subjecting a region of a patient being imaged to magnetic resonance imaging pulse sequences thereby generating magnetic resonance echoes emanating from the region;

(b) encoding the echoes with magnetic gradients;

(c) collecting the echoes as k-space data in separate consecutive acquisitions, wherein each acquisition successively fills in one of a number of distinct subsets of k-space based on the encoding of the collected echoes for that acquisition;

(d) applying a reconstruction algorithm to the k-space data after each acquisition to generate a series of temporally updated image representations of the region.

2. The method according to claim 1, wherein each of the subsets of k-space correspond to k-space data containing like spatial information.

3. The method according to claim 1, wherein the subsets of k-space are interleaved with one another.

4. The method according to claim 1, wherein all the subsets of k-space are successively acquired in accordance with a defined sequence, said defined sequence being repeated such that in subsequent repetitions k-space data from later acquisitions fill in their respective subsets of k-space replacing k-space data from corresponding prior acquisitions carried out in preceding repetitions.

5. The method according to claim 1, wherein the region is selected from a group of regions consisting of a two-dimensional cross-sectional slice of the patient and a three-dimensional volume of the patient.

6. The method according to claim 1, wherein the subsets of k-space are substantially equal in size with respect to one another.

7. The method according to claim 1, said method further comprising:

prior to step (a), introducing a bolus of contrast solution into a vascular system of the patient; and observing the series of temporally updated image representations of the region to ascertain a time of arrival of the bolus into the region.

8. The method according to claim 7, said method further comprising:

tracking progression of the bolus through the region.

9. The method according to claim 7, said method further comprising:

selecting a reference image from the series of image representations, said reference image being one of the series of image representations generated prior to arrival of the bolus into the region; and, subtracting the reference image from image representations generated after arrival of the bolus into the region.

10. A method of magnetic resonance imaging, said method comprising:

(a) generating magnetic resonance echoes which emanate from a region of a patient being imaged;

(b) acquiring the echoes as sampled data, each acquisition resulting in a distinct fractional portion of k-space being filled in, wherein the distinct fractional portions of k-space are filled in according to a defined sequential order;

(c) repeating steps (a) through (b) until k-space is completely filled in such that the distinct fractional portions of k-space are interleaved with one another;

(d) applying a reconstruction algorithm to the data in k-space to generate an image representation of the region; and, (e) after k-space has been completely filled in, continuing to repeat steps (a) through (b) such that sampled data from each successive acquisition replaces the sampled data from its corresponding previous acquisition having a like position in the defined sequential order, and repeating step (d) after each acquisition to temporally update the image representation.

11. The method according to claim 10, said method further comprising:

having the patient hold their breath during each acquisition; and, breaking between acquisitions, wherein during each break the patient is permitted to breathe.

12. The method according to claim 11, wherein k-space is not filled in during the breaks.

13. A magnetic resonance imaging apparatus comprising:

a main magnet that generates a substantially uniform, temporally constant main magnetic field through an examination region of a subject being imaged;

a magnetic gradient generator that produces magnetic gradients in the main magnetic field across the examination region;

a transmission system which includes an RF transmitter that drives an RF coil which is proximate to the examination region;

a sequence control which manipulates the magnetic gradient generator and the transmission system to produce a plurality MRI pulse sequences, each of said MRI pulse sequences inducing magnetic resonance echoes which emanate from the examination region;

a reception system which includes a receiver that receives and samples the echoes to acquire k-space data such that distinct interleaved subsets of k-space are successively filled in and updated with each acquisition;

a data memory which stores the k-space data from the receiver;

a reconstruction processor that accesses the data memory following each successive acquisition to reconstruct the k-space data into a series of temporally resolved image representations of the examination region; and an output device that converts the image representations into a human viewable display.

14. The magnetic resonance imaging apparatus according to claim 13, wherein the examination region is selected from a group of regions consisting of a two-dimensional cross-sectional slice of the subject and a three-dimensional volume of the subject.

* * * * *